United States Patent [19]

Chen et al.

[11] Patent Number: 5,017,990
[45] Date of Patent: May 21, 1991

[54] RAISED BASE BIPOLAR TRANSISTOR STRUCTURE AND ITS METHOD OF FABRICATION

[75] Inventors: Tze-Chiang Chen, Yorktown Heights; Ching-Te Kent Chuang, South Salem, both of N.Y.; Guann-Pyng Li, Irving, Calif.; Tak Hung Ning, Yorktown Heights, N.Y.

[73] Assignee: International Business Machines Corporation, Armonk, N.Y.

[21] Appl. No.: 445,251

[22] Filed: Dec. 1, 1989

[51] Int. Cl.$^5$ .................... H01L 29/72; H01L 29/04
[52] U.S. Cl. ............................ 357/34; 357/35; 357/59
[58] Field of Search ................ 357/59, 34, 35

[56] References Cited

U.S. PATENT DOCUMENTS

| | | | |
|---|---|---|---|
| T106,101 | 12/1985 | Cavaliere et al. | 357/59 |
| 3,189,973 | 6/1965 | Edwards et al. | 357/59 |
| 3,375,418 | 3/1968 | Garnache et al. | 357/59 |
| 3,600,651 | 8/1971 | Duncan | 357/59 |
| 3,611,067 | 10/1971 | Oberlin et al. | 357/59 |
| 4,051,273 | 9/1977 | Abbas et al. | 427/86 |
| 4,431,460 | 2/1984 | Barson et al. | 148/1.5 |
| 4,498,591 | 2/1985 | Tamura et al. | 156/612 |
| 4,499,657 | 2/1985 | Ooga et al. | 29/578 |
| 4,504,332 | 3/1985 | Shinada | 148/187 |
| 4,583,106 | 4/1986 | Anantha et al. | 357/59 |
| 4,789,643 | 12/1989 | Kajikawa | 437/31 |

FOREIGN PATENT DOCUMENTS

| | | | |
|---|---|---|---|
| 58-116766 | 7/1983 | Japan | 357/35 |
| 63-261748 | 10/1988 | Japan | 357/34 |
| 63-039373 | 8/1989 | Japan | 357/34 |

Primary Examiner—Jerome Jackson, Jr.
Assistant Examiner—Stephen D. Meier
Attorney, Agent, or Firm—Thomas J. Kilgannon

[57] ABSTRACT

The invention relates to a bipolar transistor structure which includes a layer of semiconductor material having a single crystal raised base, a single crystal or polycrystalline emitter and adjacent polycrystalline regions which provide an electrical connection to the emitter. The invention also relates to the method of fabricating such a structure and includes the step of depositing a conformal layer of semiconductor material of one conductivity type over a region of opposite conductivity and over insulation such that single crystal and polycrystalline regions form over single crystal material and insulation, respectively. In a subsequent step, a layer of opposite conductivity type semiconductor material is deposited on the first layer forming single crystal or polycrystalline material over single crystal and polycrystalline material over polycrystalline. Then, in a final step, the structure is subjected to an out-diffusion step which simultaneously forms a single crystal emitter region of opposite conductivity type, a p-n junction in the one conductivity type single crystal region and regions of opposite conductivity type which act as an interconnection to the emitter region.

19 Claims, 8 Drawing Sheets

RAISED BASE BIPOLAR TRANSISTOR STRUCTURE AND ITS METHOD OF FABRICATION

DESCRIPTION

Field of the Invention

The invention relates to a bipolar transistor structure which includes a layer of semiconductor material having a single crystal raised base, a single crystal or polycrystalline emitter and adjacent polycrystalline regions which provide an electrical connection to the single crystal or polycrystalline emitter. The invention also relates to the method of fabricating such a structure and includes the step of depositing a conformal layer of semiconductor material of one conductivity type over a single crystal region of opposite conductivity and over isulation such that single crystal and polycrystalline regions form over single crystal or polycrystalline material and insulation, respectively. In a subsequent step, a layer of opposite conductivity type semiconductor material is deposited on the first layer forming single crystal or polycrystalline material over single crystal and polycrystalline material over polycrystalline. Then, in a final step, the structure is subjected to an out-diffusion step which, in one embodiment, simultaneously forms a single crystal region of opposite conductivity type, a p-n junction in the one conductivity type single crystal region and regions of opposite conductivity type which act as an interconnection to the single crystal emitter region.

BACKGROUND OF THE INVENTION

Bipolar transistors with raised bases are well-known in the semiconductor transistor art.

U.S. Pat. No. 4,789,643, filed Sept. 16, 1987, shows a device in FIG. 6 thereof which may be characterized as having a raised base. In addition, the reference shows a direct connection between the intrinsic and extrinsic elements of the base. All of the elements of the structure result from the deposition of epitaxial layers of semiconductor material which are then appropriately masked and subjected to ion-implantation steps to form insulating regions and the device emitter. The reference does not use any polycrystalline layers from which base and emitter are formed nor does it incorporate method steps which form polycrystalline regions over polycrystalline material and single crystal regions over single crystal material such that, upon deposition and diffusion of a second layer, a single crystal emitter region with its associated electrical connection and a base-collector p-n junction are formed. There is no indication in the reference that differential diffusion rates in single crystal material and polycrystalline material are utilized.

U.S. Pat. No. 4,499,657, originally filed Feb. 29, 1980, however, does recognize that semiconductor material deposited over insulation will be polycrystalline in character and that single crystal material deposited over single crystal material will remain single crystal. Using this phenomenon, polycrystalline regions form the extrinsic base while single crystal regions form the intrinsic base, collector and emitter. The reference also recognizes that there are differential rates of diffusion in polycrystalline material and single crystal material. In the process of the reference, a single layer having single crystal and polycrystalline regions is deposited. In subsequent steps, two ion implantations are utilized to form the base and emitter regions. In the instance of the latter element, a separate metallization is required. This reference does not recognize that a raised base device may be obtained by conformal deposition of a pair of opposite conductivity type layers containing single crystal and polycrystalline regions and by an out-diffusion step which simultaneously forms the device emitter, the device emitter-base p-n junction, a p-n junction isolated base and an electrical connection to the emitter.

U.S. Pat. No. 4,431,460, filed Mar. 8, 1982, shows a single layer of semiconductor material deposited over a single crystal region of a substrate and over insulation covered polysilicon silicon. The single layer is subjected to ion implantation steps such that upon heating, both n and p-type dopants are introduced into the underlying substrate forming emitter and base within the substrate. There is no use of a second deposited layer nor is there any recognition that single crystal and polycrystalline regions are formed in the only polycrystalline layer deposited. Ultimately, the deposited layer forms part of the emitter contact in the reference.

U.S. Pat. No. 4,504,332, originally filed Sept. 6, 1979, shows a structure wherein the extrinsic and intrinsic bases, the emitter and the collector all stand above the substrate layer. They are all self-aligned. The process taught involves a doped layer of insulation over which a semiconductor layer is formed having a single crystal region over single crystal material and polycrystalline regions over polycrystalline material. By out-diffusing from the doped insulator, opposite conductivity type regions are formed which ultimately become extrinsic bases and a single crystal region remains between the out-diffused extrinsic bases. In subsequent steps, an intrinsic base is ion implanted and an emitter region is formed by diffusion of a dopant from an oxide. Thus, while many of the same phenomena used in the present application are invoked in this reference, such as differential diffusion rates and the formation of polycrystalline and single crystal regions over insulating or single crystal materials, respectively, a rather complex process is used to complete the transistor after a single crystal region is obtained. There is no recognition that by depositing a second opposite conductivity type layer and diffusing that an emitter, a base-emitter p-n junction and an electrical connection to the emitter could be simultaneously formed. Recognition of this step would greatly simplify the process of the reference.

U.S. Pat. No. 3,600,651, filed Dec. 8, 1969, shows a conformally deposited semiconductor layer on insulation and on single crystal semiconductor material providing polycrystalline regions over insulation and a single crystal region over single crystal material. Dopants placed in adjacent insulation provide for introducing dopant into the polycrystalline regions. In all the vertical bipolar devices disclosed in this reference, the emitters are separately diffused into the single crystal region without invoking the greatly simplified step of the present application of using a second layer of opposite conductivity type and diffusing to form the device emitter and its electrical connection.

It is, therefore, an object of the present invention to provide a bipolar transistor in which the base, emitter and electrical connection to the latter are all formed from a pair of conformally deposited semiconductor layers.

Another object is to provide a bipolar transistor having a raised intrinsic base wherein the latter is connected directly to the extrinsic base which is similarly raised.

Still another object is to provide a bipolar transistor in which a portion of the single crystal intrinsic base overlaps the ROX region of the device such that the edge punchthrough or breakdown is substantially eliminated.

Yet another object is to provide a process for fabricating bipolar transistors which is greatly simplified relative to prior art techniques.

Another object is to provide a process for fabricating bipolar transistors wherein succeeding method steps after a first conformal layer deposition do not disturb the results of the preceding steps thereby preventing edge punchthrough.

BRIEF SUMMARY OF THE INVENTION

The invention relates to a bipolar transistor structure and to its method of fabrication. The structure includes a semiconductor substrate on which a layer of polycrystalline semiconductor containing an aperture is disposed. The aperture exposes a portion of the substrate. A layer of insulation covers at least a portion of the polycrystalline layer. In one arrangement, a portion of the polycrystalline layer adjacent the substrate is exposed and in another arrangement, the polycrystalline layer is completely covered with insulation. In the first arrangement, a conformally deposited layer contains single crystal base and emitter regions over a collector region. The single crystal regions are partially bounded by a polycrystalline region which forms an interface with the single crystal regions. A mesa-like base-emitter junction is formed in the single crystal region which has a portion thereof which is roughly parallel to the single crystal-polycrystalline interface and terminates on the insulation. The polycrystalline region acts as a contact to the single crystal emitter region. In the second arrangement, the polycrystalline layer is out-diffused to form extrinsic base regions. A conformally deposited layer contains single crystal and polycrystalline regions which join at a single crystal-polycrystalline interface. The single crystal region contains a raised base portion and an emitter portion both of which meet at a mesa-like p-n junction. The latter has a portion roughly parallel to the single crystal-poly interface and terminates on the insulation. In addition, the raised base portion links to the extrinsic base regions. The polycrystalline region acts as an electrical connection to the emitter region.

In fabricating the structure of the invention, two layers of semiconductor material are conformally deposited over insulation covered semiconductor regions disposed on a substrate. The semiconductor regions are masked and etched to form an aperture. In one instance, the etching undercuts the insulation to expose a portion of the semiconductor region adjacent the substrate and, in another instance, the etching leaves the insulation unaffected. When the semiconductor layers are conformally deposited, a single crystal region is aligned with the exposed substrate portion and polycrystalline regions form over the insulation forming a single crystal-polycrystalline interface in the layers. In the instance of the undercut insulation, the first conformally deposited layer connects with the exposed portion of the semiconductor region. Once the second layer, which is of opposite conductivity type to the first layer, is conformally deposited, it is out-diffused forming a mesa-like emitter-base p-n junction, a portion of which is flat and another portion of which is roughly parallel to the single crystal-polycrystalline interface and terminates on insulation. The formation of the emitter and base regions depends on the slower diffusion in single crystal material than in polycrystalline material. To the extent diffusion is much faster in polycrystalline material, the out-diffusion step converts all the polycrystalline material of the first layer to the same conductivity type as the second layer and the converted polycrystalline region acts as an electrical interconnection to the emitter which is of the same conductivity type. Where there is no undercutting of the insulation, the polycrystalline regions are out-diffused to form an extrinsic base in the substrate and the single crystal portion of the first conformally deposited layer links to the extrinsic bases. Otherwise, the formation of the emitter, base and interconnection to the emitter proceed as in the instance of the undercut insulation. One aspect which results from the process is that when the first layer is conformally deposited over recessed oxide (ROX), the single crystal portion of the layer extends over or overlaps the ROX. The deposition of the second conformal layer and other processing steps do not disturb this overlap as often occurs in prior art methods and the result is that edge punchthrough or breakdown is substantially eliminated. From the foregoing, it should be clear that, relative to the prior art approaches, the present method provides a superior device using a simplified method which greatly reduces the number of steps required.

The foregoing and other objects, features and advantages of the present invention will become more apparent from the following more particular description of a preferred embodiment.

DESCRIPTION OF THE PREFERRED EMBODIMENTS

Figure 1:
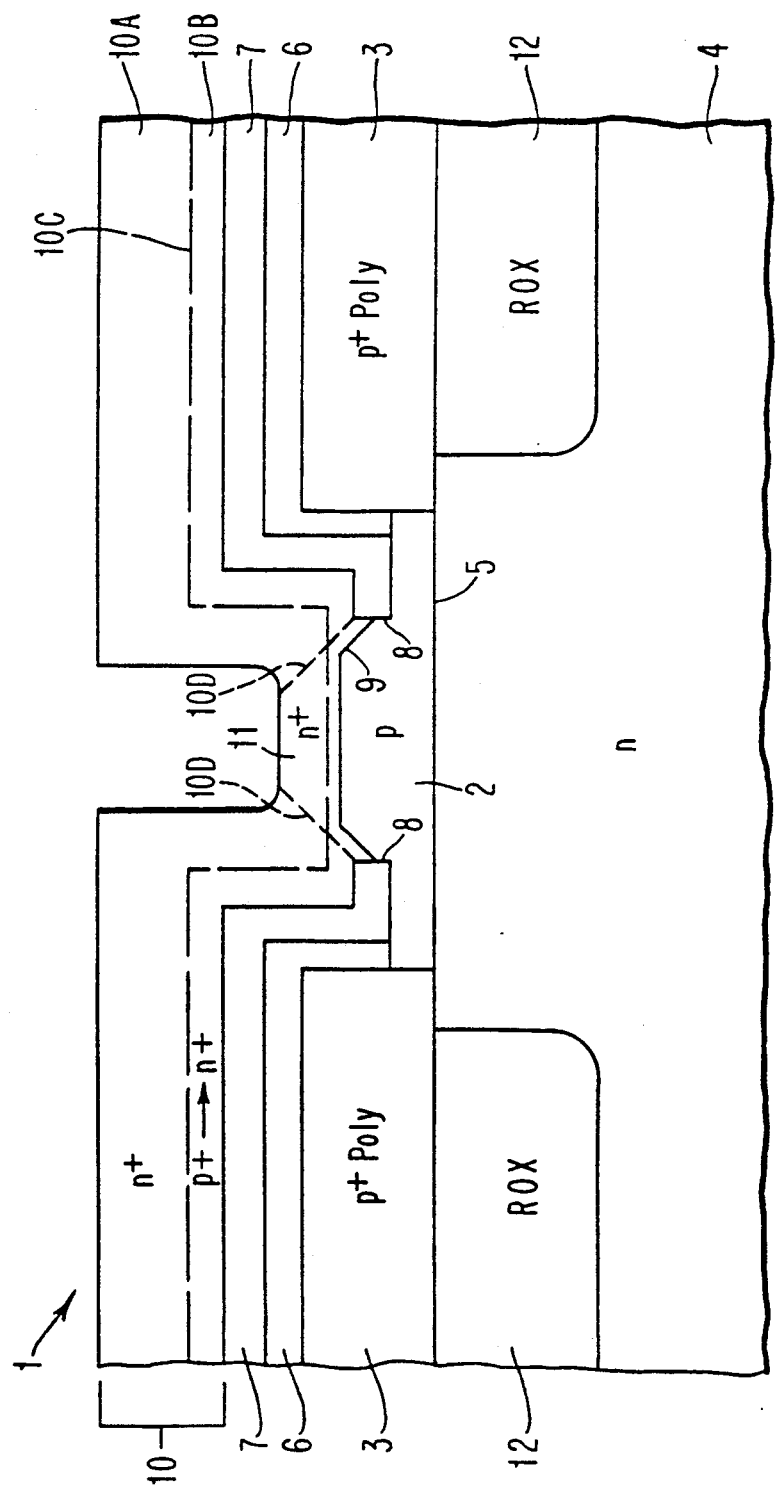
FIG. 1 is a simplified, cross-sectional view of a bipolar transistor in accordance with the teachings of the present application showing raised intrinsic and extrinsic bases.

In FIG. 1, there is shown a simplified cross-sectional view of a bipolar transistor 1 which includes a raised, single-crystal, intrinsic base 2 connected directly to a pair of polycrystalline semiconductor regions which form extrinsic base 3. Intrinsic base 2, which is shown in FIG. 1 as a region of p-conductivity type semiconductor, is disposed on an n-conductivity type semiconductor substrate which forms the collector 4 of transistor 1. A base-collector p-n junction 5 is formed at the interface between base 2 and collector 4. Oxide layers 6 partially cover the polycrystalline regions of extrinsic base 3 except where the latter are directly connected to intrinsic base 2. Layers 7 of silicon nitride cover oxide layers 6 and include extensions 8, the ends of which define the width of the base-emitter p-n junction 9. The latter has a mesa-like shape, the sides of which terminate at one end on extensions 8 and, at the other ends thereof, terminate on the ends of the flat portion of p-n junction 9. As will be seen hereinafter in the discussion of the fabrication of transistor 1, p-n junction 9 results from the differential rates of diffusion of a dopant in single crystal semiconductor material and in polycrystalline semiconductor material. In FIG. 1, layer 10 is made of a pair of layers 10A, 10B of semiconductor material which are polycrystalline in character when deposited over insulation material or over polycrystalline semiconductor material and single crystal semiconductor material. A dashed line 10C indicates the relative thicknesses of layers 10A, 10B when deposited. Dotted lines 10D extending obliquely from extensions 8 through layers 10A, 10B indicate the interface between polycrystalline semiconductor material and single crystal semiconductor material. Thus, in addition to intrinsic base 2, the single crystal material between dotted lines 10D forms emitter 11 of transistor 1 and is shown in FIG. 1 as a region of n+-conductivity type semiconductor material. In FIG. 1, it should be noted that the interfaces between single crystal and polycrystalline semiconductor material indicated by dotted lines 10D run roughly parallel to the sides of mesa-like p-n junction 9 and simultaneously form an electrical connection between emitter 11 and the remaining single crystal n+ portions of layers 10A and 10B. Recessed oxide (ROX) regions 12 are formed in collector 4 to provide the usual isolation found in such devices. While not specifically shown in FIG. 1, since they form no part of the present invention, it should be appreciated that electrical contact will be provided to extrinsic base 3 and collector 4 in the usual and well-known manner. It should be understood that the structure of FIG. 1 may be made up of elements of opposite conductivity type to those shown in FIG. 1. Thus, the npn device of FIG. 1 may be a pnp device by changing the type of dopant introduced into silicon semiconductor material, for example.

In the above described arrangement of FIG. 1, a single layer 10 containing polycrystalline and single crystal semiconductor regions is shown. By using the phenomenon of growing or depositing single crystal material over single crystal material and growing or depositing polycrystalline material over polycrystalline material or insulation, the stage is set for the use of another phenomenon; that of a dopant's ability to diffuse at a much higher rate in polycrystalline material than in single crystal semiconductor material.

By using these phenomena, most of layer 10 is converted to one conductivity type while simultaneously forming p-n junctions in single crystal regions like intrinsic base 2 where diffusion is slow and remains as the opposite conductivity type region as originally formed. An electrical connection to emitter 11 which includes polycrystalline regions of opposite conductivity type (p-type polycrystalline layer 10B) converted to the one conductivity type (n-type) as a result of fast diffusion from layer 10A into the polycrystalline semiconductor material of layer 10B is also formed. The resulting device thus includes a built-in emitter region 11 which requires no separate diffusion or ion implantation step to form it.

Finally, while FIG. 1 has been described as a two-dimensional structure, it should be understood that the device of FIG. 1 is in reality a three-dimensional structure. Thus, for example, p-n junction 9 defines a portion of intrinsic base 2 which has a mesa-like configuration with a flat top. Similarly, interfaces 10D shown as two interfaces are in reality the surface of a truncated cone of single crystal material which forms but a single interface with the surrounding polycrystalline material. Also, polycrystalline regions 3 are part of an aperture of any desired shape which is totally bounded by polycrystalline material. In like manner, oxide layer 6 and nitride layer 7 with its extensions 8 are formed over layer 3 and extend around the periphery of the aperture in layer 3.

Figure 2:
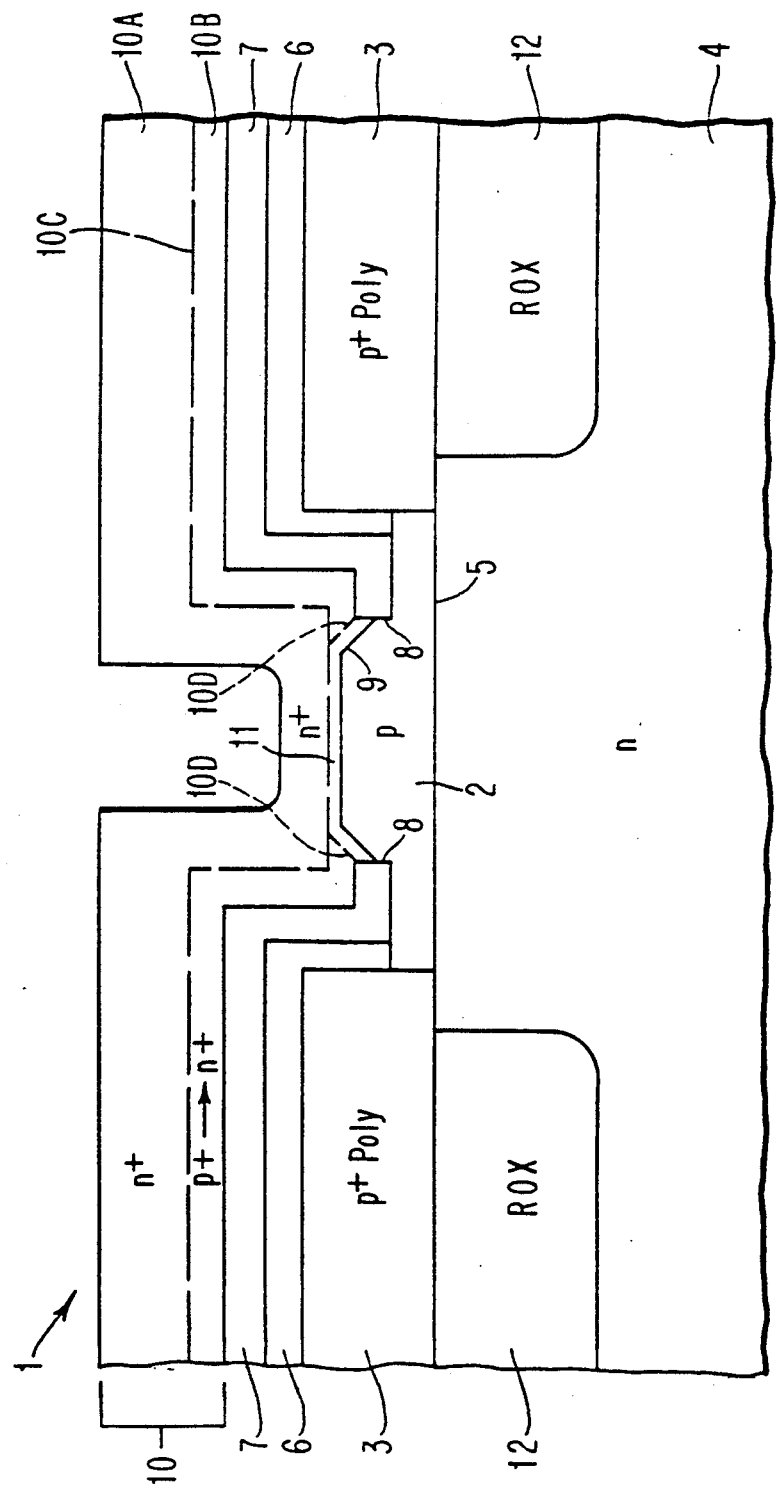
FIG. 2 shows another embodiment of the present invention in which layer 10A is polycrystalline in character over all regions.

In another embodiment shown in FIG. 2, layer 10A is polycrystalline in character over all regions. In this case, dotted lines 10D extend obliquely from extensions 8 through layer 10B and terminate at 10C between layer 10A and layer 10B. 10C becomes an interface between single crystal material and polycrystalline material between doted lines 10D.

FIGS. 3 through 6 show simplified cross-sectional views of the structure of FIGS. 1 and 2 at various intermediate stages in their fabrication.

Figure 3:
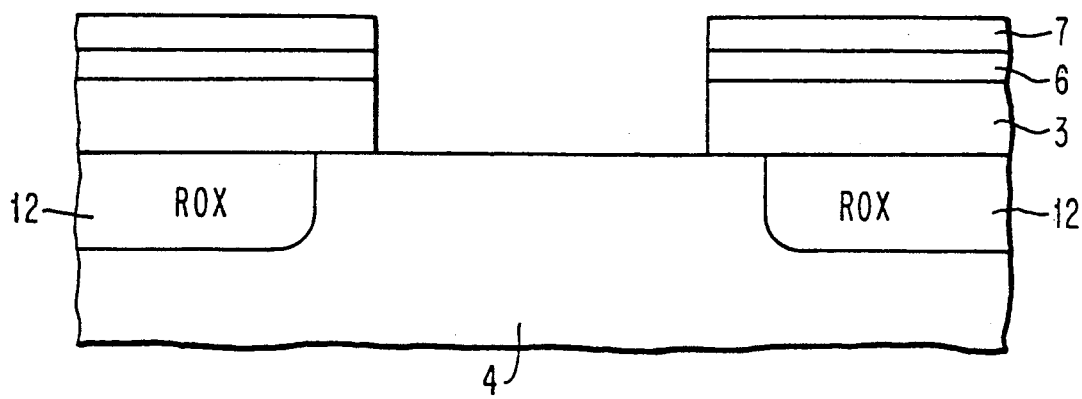
FIGS. 3-6 show simplified cross-sectional views of the structure of FIGS. 1 and 2 at various intermediate stages in its fabrication.

FIG. 3 shows a cross-sectional view of an n-type silicon semiconductor substrate which ultimately forms collector 4 of transistor 1 of FIGS. 1 and 2. A layer of heavily boron doped polycrystalline silicon 3 is deposited by chemical vapor deposition (CVD) on the surface of the silicon substrate in a well-known manner. A layer of silicon dioxide 6 and a layer of silicon nitride 7 are deposited in succession on layer 3 using techniques well-known to those skilled in the semiconductor fabrication arts. Then using photolithographic masking and etching techniques, both nitride layer 7 and oxide layer 6 are patterned. Polycrystalline layer 3 is then subjected to wet etching or reactive ion etching (RIE) in a well-known way to expose a portion of the surface of substrate 4.

Figure 4:
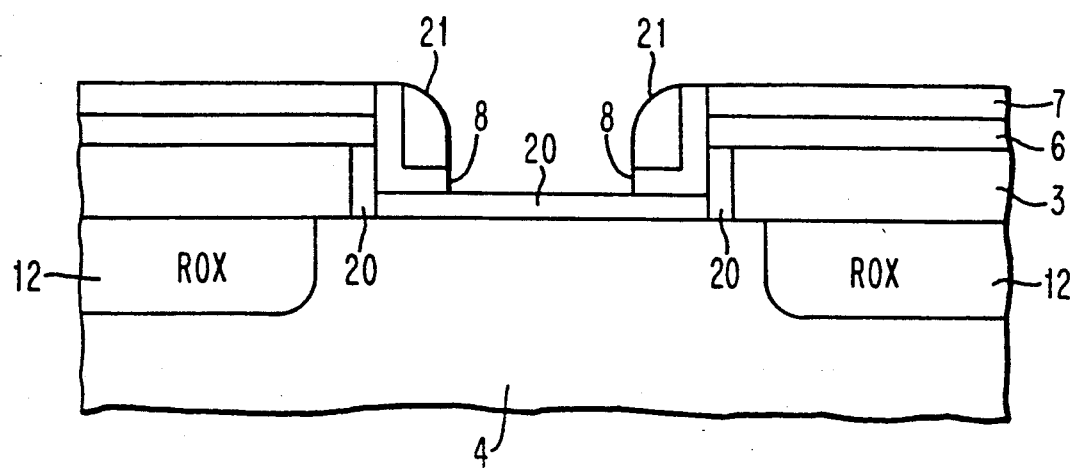

FIG. 4 shows a cross-sectional view of the structure of FIGS. 1 and 2 at a later intermediate stage in the fabrication process. After the exposure of a portion of the surface of substrate 4, the structure of FIG. 3 is subjected to a thermal oxidation step which forms a thermal oxide layer 20 on the exposed surface of substrate 4 and the exposed portions of polycrystalline layer 3. In subsequent steps, layers of silicon nitride and an oxide are conformally deposited in a well-known way over nitride layer 7 and thermal oxide layer 20. These newly deposited layers are then subjected to reactive ion etching which end-points on oxide layer 20 producing side-walls as shown in FIG. 4 which include nitride extensions 8 and oxide portions 21.

Figure 5:
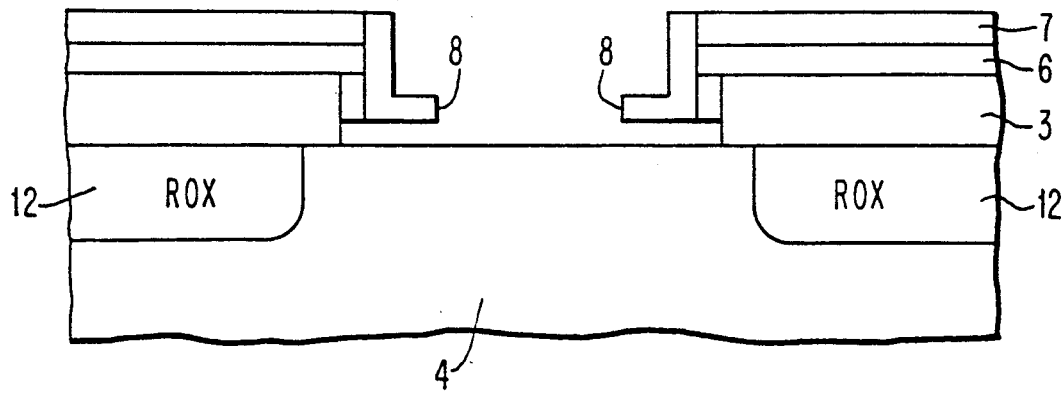

At this point, buffered hydrofluoric acid (BHF) is used to dip etch away the horizontal portion of thermal oxide layer 20, and oxide portion 21, leaving the intermediate structure shown in the cross-sectional view of FIG. 5. It should be noted at this point, that with the horizontal portion of thermal oxide 20 completely etched away, extensions 8 now hang over the exposed surface of substrate 4.

Figure 6:
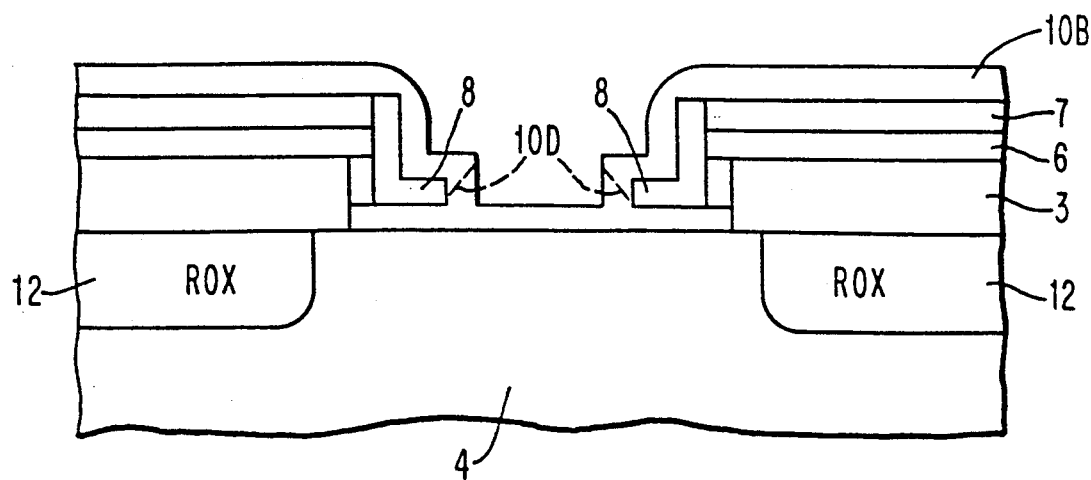

FIG. 6 shows a simplified cross-sectional view of the device of FIGS. 1 and 2 after a conformal layer of silicon semiconductor material is deposited over the structure of FIG. 5. To accomplish this, a thin layer of p-conductivity type silicon is deposited using well-known low-temperature ultra-high-vacuum chemical vapor deposition (LT UHV/CVD) techniques such as described in an article entitled "Low-temperature silicon epitaxy by ultrahigh vacuum chemical vapor deposition," by B. S. Meyerson, Applied Physics Letters, vol. 48, no. 12, pages 797–799, 1986. This results in the deposition of single crystal semiconductor material on the exposed surface of collector 4 forming collector-base p-n junction 5 and simultaneously the deposition of polycrystalline semiconductor material over silicon nitride layer 7 and extensions 8 forming dotted line portions of interface 10D in layer 10B which are the interfaces between single crystal and polycrystalline semiconductor materials. Interfaces 10D extend obliquely from extension 8. It should be noted that, using this deposition technique, the deposited layer forms under extensions 8 and connects electrically with p-type polycrystalline regions 3 which ultimately act as the extrinsic base of transistor 1. After boron doped layer 10B is deposited, a second layer 10A of heavily doped n-type semiconductor material is deposited conformally over layer 10B. Layer 10A, preferably silicon, can be formed by the deposition scheme similar to that used for depositing layer 10B, with the n-type dopant such as arsenic or phosphorus introduced in situ during deposition. Alternatively, layer 10A can be all polycrystalline silicon (as in FIG. 2) formed by well-known chemical vapor deposition techniques with the n-type dopant introduced in situ during deposition or by well-known ion implantation techniques after deposition. Once layer 10A is deposited, the layers are subjected to a heating step which causes the n-type dopant in layer 10A to diffuse into the polycrystalline portion of layer 10B at a much higher rate than into the single crystal portion of layer 10B. This results in the conversion of the polycrystalline regions of layer 10B from p-conductivity type to n-conductivity type. At the same time, the n-type dopant in layer 10A diffuses at a much lower rate (more than 10 times less) into the single crystal portion of layer 10B forming the flat portion of p-n junction 9 and sides thereof. The p-n junction 9 thus formed has a flat horizontal portion and an oblique portion extending between extensions 8 and the said flat portion in a direction roughly parallel to interfaces 10D. The diffusion step simultaneously forms p-n junction 9, emitter 11 and an n-conductivity type interconnection in the form of layer 10 to emitter 11 providing the final structures shown in FIGS. 1 and 2. All that remains is to provide contacts to extrinsic base 3 and collector 4 which can be easily carried out in a well-known way by those skilled in the semiconductor arts.

Figure 7:
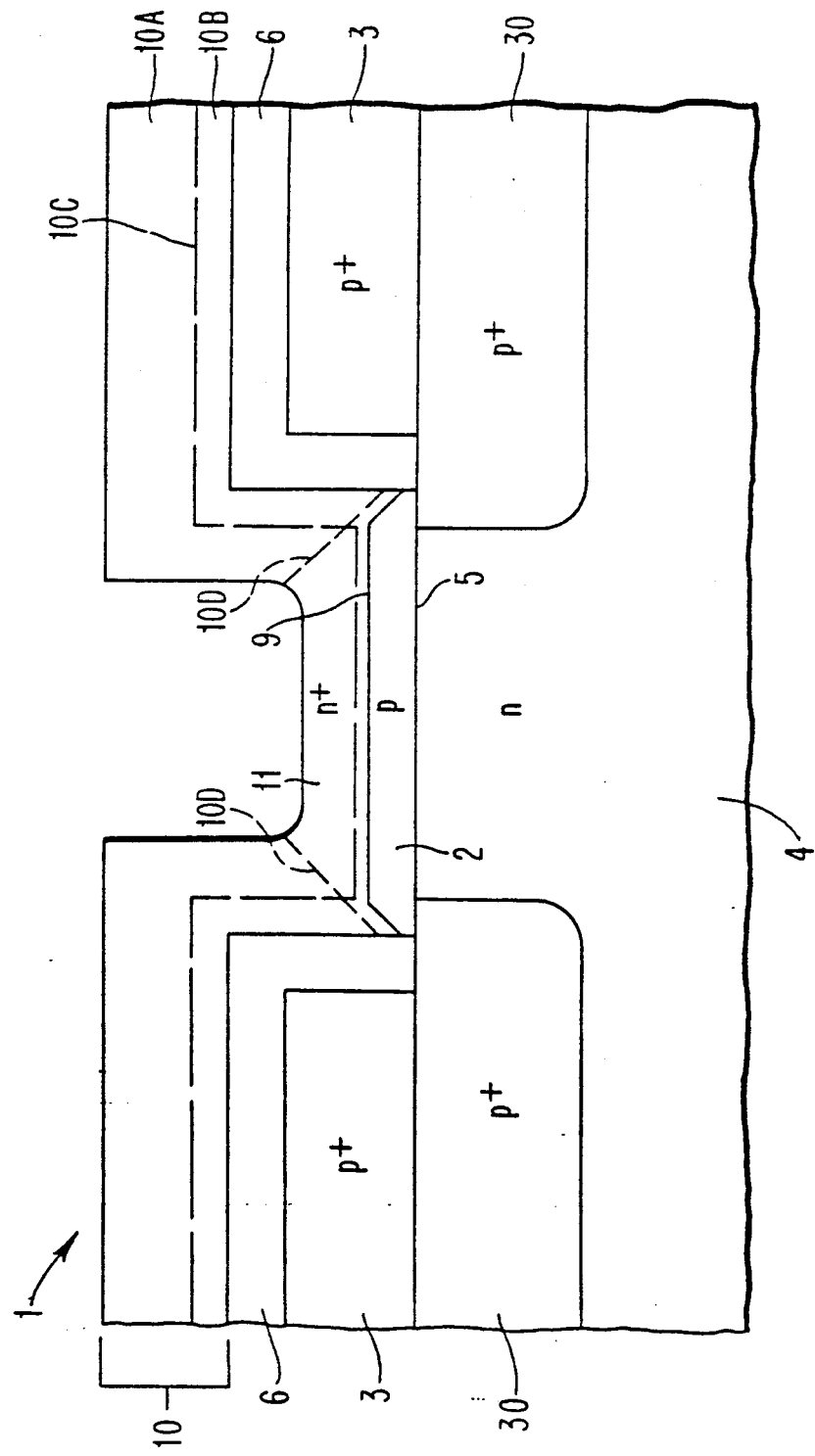
FIG. 7 shows a simplified cross-sectional view of another preferred embodiment of the present invention which incorporates a raised intrinsic base and an extrinsic base disposed in the substrate.

FIG. 7 shows a simplified cross-sectional view of another preferred embodiment of the present invention which incorporates a raised intrinsic base with an extrinsic base disposed in the substrate. Elements which are similar in FIG. 1 are identified with the same reference characters in FIG. 7.

Figure 9:
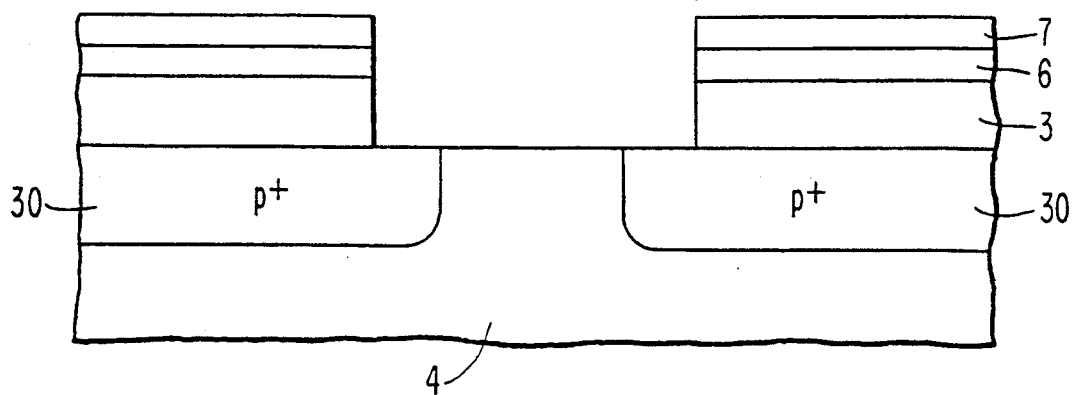
FIGS. 9 and 10 show simplified cross-sectional views of the device of FIG. 6 at an intermediate stage in their fabrication.

The process utilized in fabricating the device of FIG. 7 is similar to that used in fabricating the device of FIGS. 1 and 2 except that the extrinsic base is extended into the substrate and nitride layer 7 with extensions 8 are not required. When the intermediate structure shown in FIG. 3 is arrived at, a drive-in step is carried out to diffuse boron into substrate 4 from polycrystalline regions 3 forming extrinsic base regions 30, as shown in the cross-sectional view of FIG. 9.

Figure 10:
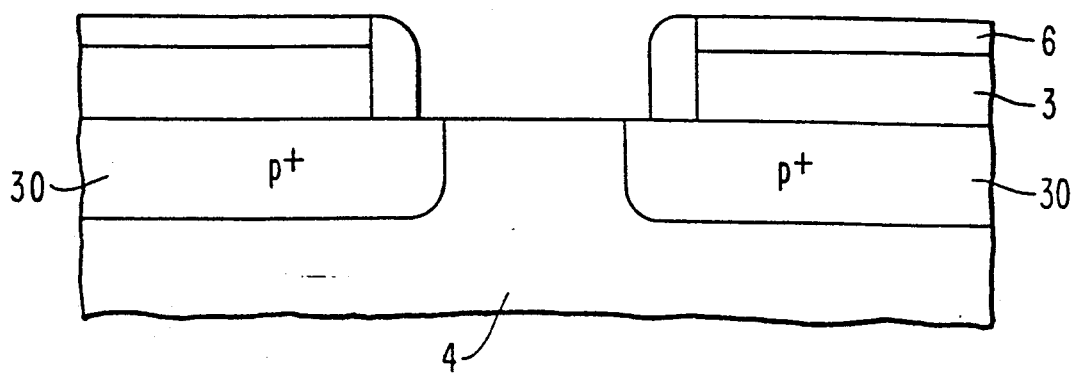

Once this is done, nitride layer 7 is removed by well-known etching techniques such as using phosphoric acid. Then an insulating sidewall is formed as shown in FIG. 10. This is accomplished by depositing an insulating layer, such as oxide, followed by reactive ion etching. Substrate 4 is then given a slight dip-etch to remove any oxide from the exposed surface of substrate 4 providing a clean surface for the deposition of layer 10B. The latter is conformally deposited over the exposed surface of substrate 4, where the deposited layer is single crystal in character, and over the oxide, where the deposited layer is polycrystalline in character. The technique for forming layer 10B for the device in FIG. 7 is the same as that in FIG. 8, where the elements are identical to those in FIG. 1.

Electrical connection between intrinsic base 2 and extrinsic base 30 is provided by the overlap between intrinsic base 2 and extrinsic base 30 at the edge of the sidewall insulator, as shown in FIG. 7. In a final step, layer 10A is deposited and is identical to that shown in forming the device of FIG. 1. This results in the structure of FIG. 7 which only requires base and collector contacts to complete it.

Figure 8:
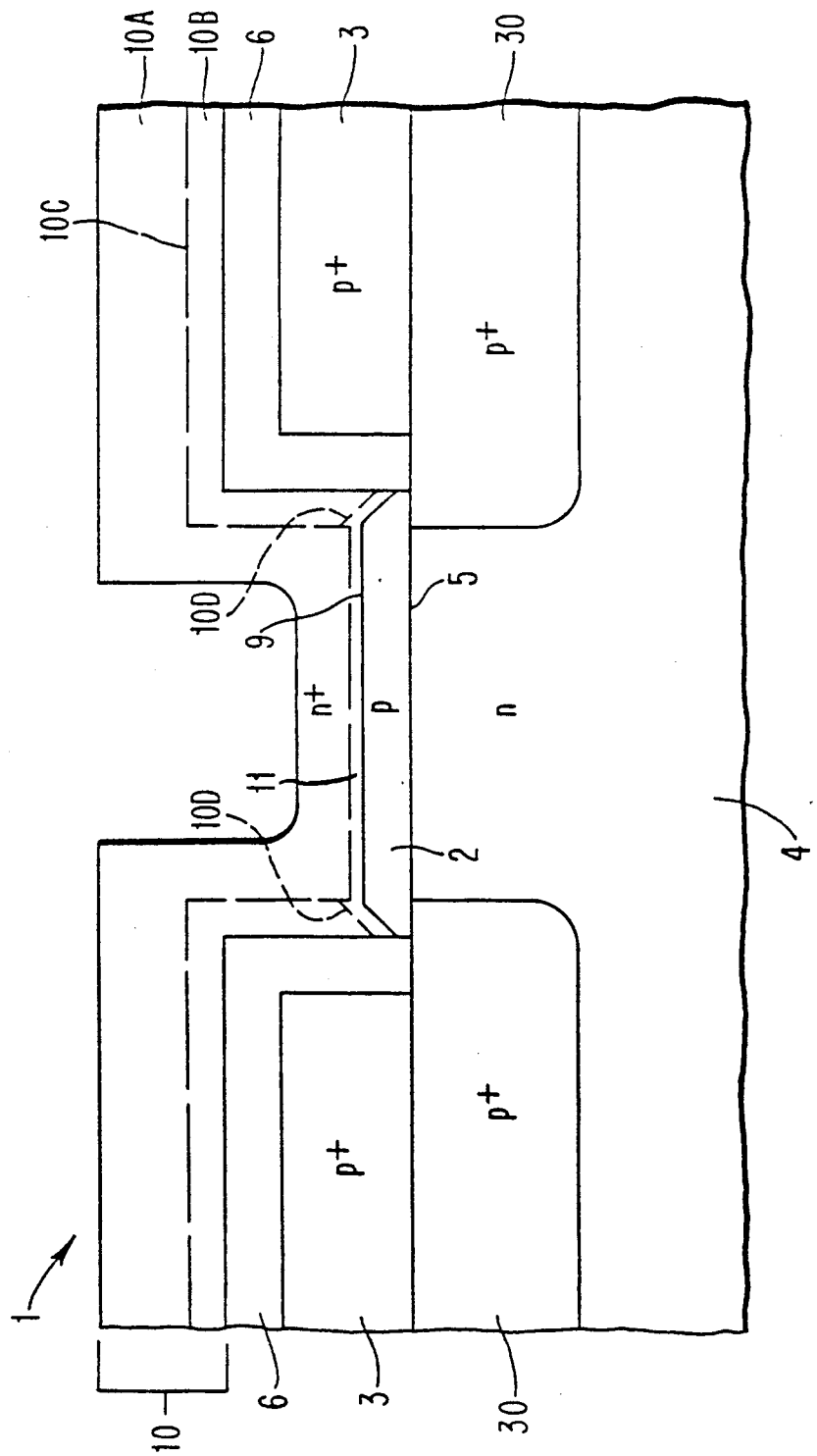
FIG. 8 shows a variation of the structure of FIG. 7 in which layer 10A is polycrystalline in character over all the regions.

Another embodiment of the present invention is shown in FIG. 8, where the elements are identical to those in FIG. 7, except layer 10A is polycrystalline in character over all underlying regions.

Figure 11:
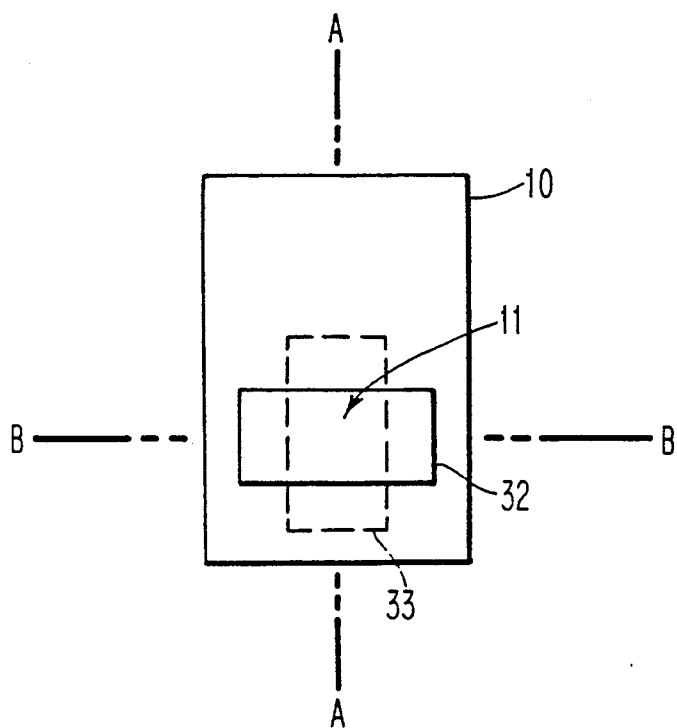
FIG. 11 is a layout drawing of the structure of FIGS. 1, 2, 7 and 8 showing an emitter window and a window in the ROX region.
Figure 12:
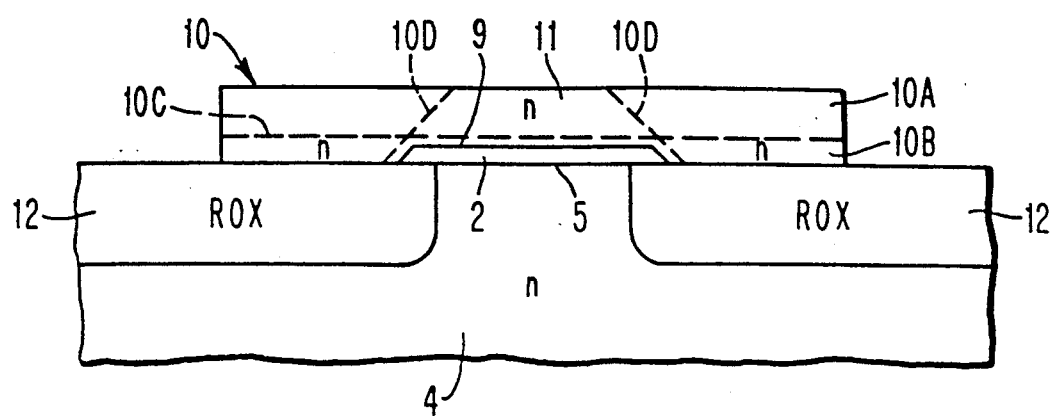
FIG. 12 is a cross-sectional view taken along the line B—B of FIG. 11 which is orthogonal to the cross-sectional views of other FIGS. herein.

The process which forms the structures of FIGS. 1, 2, 7 and 8, permits the formation of the emitter-base junction in a single crystal portion of a deposited layer and simultaneously converts the remaining polycrystalline portion of said same layer into opposite conductivity type for electrical connection to the emitter region. The approach results in benefits which are not obtainable using other structures and processes. Considering now FIG. 11, which is a layout drawing of the structure of the device of FIGS. 1, 2, 7 and 8, showing an emitter window 32 and a window 33 in ROX region 12 within which collector 4 resides. A polycrystalline layer 10 is shown disposed over ROX region 12, a portion which forms emitter 11. Dashed line A—A in FIG. 11 is a line along which a cross-sectional view is obtained resulting in cross sections like those shown in FIGS. 1, 2, 7 and 8. Dashed line B—B in FIG. 11 is a line along which a cross-sectional view orthogonal to the view taken along dashed line A—A can be obtained. Such a view, corresponding to devices in FIGS. 1 and 7, is shown in FIG. 12 wherein ROX regions 12 bound collector 4 and layers 10A and 10B of silicon semiconductor material include intrinsic base 2 and emitter 11. Dotted lines 10D show the interface between the polycrystalline and single crystal regions and base-emitter junction 9 exhibits a mesa-like structure similar to that shown in FIGS. 1 and 2. A corresponding view for devices in FIGS. 2 and 8 is identical to FIG. 12, except the dotted line 10D for the interface between the polycrystalline and single crystal regions terminates at line 10C. Note in FIG. 12 that the single crystal region overlaps ROX regions 12 as indicated by the positioning of dotted lines 10D which terminate on ROX regions 12. Once the polycrystalline-single crystal interfaces 10D have been determined during growth, their position remains unchanged during further processing. Furthermore, both the horizontal flat portion and the oblique portion of emitter-base junction 9 are separated from collector 4 by intrinsic base 2, eliminating the possibility of emitter-to-collector punchthrough.

In the fabrication of the devices of FIGS. 1, 2 7 and 8, the doping levels of the various elements of devices 1 are as follows:

| | | |
|---|---|---|
| collector 4 | $1 \times 10^{16}$ cm$^{-3}$ | $5 \times 10^{17}$ cm$^{-3}$ |
| intrinsic base 2 | $1 \times 10^{18}$ cm$^{-3}$ | $1 \times 10^{19}$ cm$^{-3}$ |
| extrinsic base 3 | $1 \times 10^{19}$ cm$^{-3}$ | $1 \times 10^{20}$ cm$^{-3}$ |
| emitter 11 | $5 \times 10^{19}$ cm$^{-3}$ | $1 \times 10^{21}$ cm$^{-3}$ |
| layer 10A (as deposited) | $5 \times 10^{19}$ cm$^{-3}$ | $1 \times 10^{21}$ cm$-3$ (same as emitter) |
| layer 10B (as deposited) | $1 \times 10^{18}$ cm$^{-3}$ | $1 \times 10^{19}$ cm$-3$ (same as intrinsic base) |

In the above described FIGS., it should be appreciated that the various elements have not been drawn to exact scale and that some dimensions have been emphasized so that the invention disclosed can be clearly understood.

Having thus described our invention, what we claim as new, and desire to secure by Letters Patent is:

1. A bipolar transistor comprising:
a semiconductor substrate of one conductivity type,
a first layer of semiconductor material of second conductivity type disposed on said substrate said layer containing an aperture which exposes a portion of said substrate,
at least a layer of insulation covering at least a portion of said first layer of semiconductor material,
a second layer of semiconductor material conformally disposed over said layer of insulation and in said aperture said second layer containing a polycrystalline region disposed over said layer of insulation and a single crystal semiconductor region disposed over said exposed portion of said substrate forming at least a single polycrystalline-single crystal interface between said single crystal and said polycrystalline regions,
said second layer of semiconductor material being of said one conductivity type and having a region of said second conductivity type disposed therein over said exposed portion of said substrate forming a semiconductor junction in said single crystal semiconductor region said junction defining the base and emitter regions of said transistor, a portion of said junction being parallel with said at least a single interface and terminating on said insulation said polycrystalline region being electrically connected to said emitter region.

2. A bipolar transistor according to claim 1 wherein said semiconductor substrate is made of single crystal semiconductor material.

3. A bipolar transistor according to claim 1 wherein said semiconductor substrate is made of single crystal silicon.

4. A bipolar transistor according to claim 1 wherein said one conductivity type is n-conductivity type.

5. A bipolar transistor according to claim 1 wherein said one conductivity type is p-conductivity type.

6. A bipolar transistor according to claim 1 wherein said first layer is polycrystalline semiconductor material.

7. A bipolar transistor according to claim 1 wherein said first layer is polycrystalline silicon.

8. A bipolar transistor according to claim 1 wherein said at least a layer of insulation is a layer of silicon dioxide disposed on all surfaces of said first layer.

9. A bipolar transistor according to claim 1 wherein said at least a layer of insulation is a composite layer of silicon nitride and silicon dioxide disposed on the upper surface and sidewall of said first layer except for an undercut portion of said composite layer which exposes a portion of said sidewall.

10. A bipolar transistor according to claim 1 wherein said polycrystalline region is of said one conductivity type and said single crystal region includes a region of said one conductivity type separated from a region of opposite conductivity type by said semiconductor junction.

11. A bipolar transistor according to claim 10 wherein said one conductivity type is n-conductivity type and said opposite conductivity type is p-conductivity type.

12. A bipolar transistor according to claim 10 wherein said one conductivity type is p-conductivity type and said opposite conductivity type is n-conductivity type.

13. A bipolar transistor according to claim 1 wherein said emitter region includes a single crystal portion conformal with said semiconductor junction electrically connected to said polycrystalline region at said at least a single interface.

14. A bipolar transistor according to claim 1 wherein said emitter region includes a single crystal portion conformal with said semiconductor junction said emitter region extending from said p-n junction to the surface of said second layer and being connected to said polycrystalline region at said at least a single interface.

15. A bipolar transistor according to claim 1 wherein said base region is disposed atop said substrate forming semiconductor junction therewith.

16. A bipolar transistor according to claim 1 further including a region of recessed oxide disposed in said substrate at least a portion of said recessed oxide being disposed under said first layer of semiconductor material.

17. A bipolar transistor according to claim 16 wherein at least a portion of said single crystal semiconductor region overlaps said recessed oxide region.

18. A bipolar transistor according to claim 1 further including a region of recessed oxide disposed in said substrate and at least a portion of said base region overlapping said recessed oxide region.

19. A bipolar transistor according to claim 1 further including at least a region of second conductivity disposed in said substrate said at least a region of second conductivity type being electrically connected to said base region.

* * * * *